US008400856B2

(12) United States Patent
Patel (10) Patent No.: US 8,400,856 B2
(45) Date of Patent: Mar. 19, 2013

(54) MEMORY DEVICE WITH DATA PREDICTION BASED ACCESS TIME ACCELERATION

(75) Inventor: Manish Umedlal Patel, Bangalore (IN)

(73) Assignee: LSI Corporation, Milpitas, CA (US)

( * ) Notice: Subject to any disclaimer, the term of this patent is extended or adjusted under 35 U.S.C. 154(b) by 270 days.

(21) Appl. No.: 13/031,807

(22) Filed: Feb. 22, 2011

(65) Prior Publication Data

US 2012/0213024 A1    Aug. 23, 2012

(51) Int. Cl.
G11C 7/00    (2006.01)
(52) U.S. Cl. .................... 365/203; 365/204
(58) Field of Classification Search ............. 365/203, 365/204
See application file for complete search history.

(56) References Cited

U.S. PATENT DOCUMENTS 5,381,374 A * 1/1995 Shiraishi et al. ......... 365/185.25
7,813,161 B2   10/2010 Luthra
2009/0109780 A1  4/2009 Chang et al.

OTHER PUBLICATIONS

H. Noguchi et al., "A 10T Non-Precharge Two-Port SRAM for 74% Power Reduction in Video Processing," IEEE Computer Society Annual Symposium on VLSI (ISVLSI), May 2007, 6 pages.

* cited by examiner

Primary Examiner — Son Dinh
Assistant Examiner — Nam Nguyen
(74) Attorney, Agent, or Firm — Ryan, Mason & Lewis, LLP (57) ABSTRACT

A memory device includes a memory array including a plurality of memory cells, sensing circuitry coupled to at least a given bitline associated with a particular column of the memory cells of the memory array, and access time acceleration circuitry coupled to the bitline. The access time acceleration circuitry is configured to control an amount of time required by the sensing circuitry to access data stored in a given one of the memory cells in the particular column of memory cells, by providing in a current access cycle at least a selected one of a plurality of different supplemental charging and discharging paths for the bitline based at least in part on data accessed using the bitline in a previous access cycle. By way of example, the different supplemental charging and discharging paths may comprise an additional pull-up path configured to supplement operation of a pull-up path of the given memory cell and an additional pull-down path configured to supplement operation of a pull-down path of the given memory cell.

20 Claims, 6 Drawing Sheets

MEMORY DEVICE WITH DATA PREDICTION BASED ACCESS TIME ACCELERATION

FIELD OF THE INVENTION

The present invention relates generally to semiconductor memory devices, and more particularly to techniques for reducing the amount of time required to access data stored in such devices.

BACKGROUND OF THE INVENTION

A semiconductor memory device typically includes an array of memory cells arranged in rows and columns, with each memory cell configured to store one or more bits of data. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into a precharge phase and an active phase, with the precharge phase being used to precharge the bitlines to a precharge voltage, and the active phase being used to read or write one or more memory cells of the array. Reading a given memory cell generally comprises transferring data stored within that cell to its corresponding bitline, and writing a given memory cell generally comprises transferring data into that cell from its corresponding bitline.

Memory cell access time is becoming an increasingly important issue in memory device design. For example, excessive memory cell access times can lead to performance bottlenecks in high speed processors. Conventional approaches to reading data from a memory cell include the use of differential balanced sense amplifiers or single-ended unbalanced sense amplifiers. However, as transistor dimensions continue to shrink, such conventional approaches can become problematic at least in part due to local transistor mismatch in the sense amplifier circuitry.

An alternative approach to reading data from a memory cell is known as inverter sensing. In this approach, a given read bitline of the memory device is read directly using an inverter and associated logic circuitry. This approach has some significant advantages over the conventional sense amplifier approaches previously described. For example, it avoids the problems relating to local transistor mismatch. Also, the inverter sensing approach does not utilize a precharge phase, thereby allowing precharge circuitry and output latch logic to be eliminated. Inverter sensing circuitry can therefore operate at a lower voltage and reduced power relative to conventional sense amplifiers. Unfortunately, conventional inverter sensing can be slower than the sense amplifier approaches, particularly in memory devices in which both rising and falling bitline transitions are used to read data. Thus, memory access times may be unduly long when using conventional inverter sensing.

SUMMARY OF THE INVENTION

Illustrative embodiments of the present invention overcome one or more of the drawbacks of the conventional approaches described above by providing a memory device which includes data prediction based access time acceleration circuitry. A given such illustrative embodiment significantly improves the memory cell access times that are achievable using an inverter sensing approach while also retaining the advantages of inverter sensing over conventional sense amplifier approaches.

In accordance with one aspect of the invention, a memory device includes a memory array comprising a plurality of memory cells. The memory device further includes sensing circuitry coupled to at least a given bitline associated with a particular column of the memory cells of the memory array, and access time acceleration circuitry coupled to the bitline. The access time acceleration circuitry is configured to control an amount of time required by the sensing circuitry to access data stored in a given one of the memory cells in the particular column of memory cells, by providing in a current access cycle at least a selected one of a plurality of different supplemental charging and discharging paths for the bitline based at least in part on data accessed using the bitline in a previous access cycle.

In one of the illustrative embodiments, the different supplemental charging and discharging paths selectively provided for the bitline by the access time acceleration circuitry may comprise an additional pull-up path configured to supplement operation of a pull-up path of the given memory cell, and an additional pull-down path configured to supplement operation of a pull-down path of the given memory cell. The access time acceleration circuitry may be configured in this embodiment to select the additional pull-up path for the bitline if the data accessed using the bitline in the previous access cycle has a logic low level, and to select the additional pull-down path for the bitline if the data accessed using the bitline in the previous access cycle has a logic high level.

The access time acceleration circuitry in an illustrative embodiment may comprise a pulse generator circuit, a reference memory cell having an input coupled to an output of the pulse generator circuit and an output coupled to the bitline, and feedback circuitry having an input coupled to an output of a bitline sensing inverter of the sensing circuitry and an output coupled to another input of the reference memory cell. The pulse generator circuit is configured to generate complemented and uncomplemented clock pulse signals for application to respective transistors of the reference memory cell. A first one of the transistors may be part of a supplemental charging path and a second one of the transistors may be part of a supplemental discharging path, and a pulse duration of the clock pulse signals may determine an amount of time for which the selected supplemental charging path or supplemental discharging path is enabled. The selected supplemental path may therefore be enabled for an amount of time that is substantially less than a duration of the current access cycle and is determined by a pulse width of the clock pulse signals generated by the pulse generator circuit.

Advantageously, one or more of the illustrative embodiments provide a memory device that exhibits substantially reduced access times relative to conventional devices that utilize inverter sensing. For example, a given illustrative embodiment exhibits a significantly reduced delay interval between a given wordline assertion and the corresponding bitline transition, leading to shorter memory access time for both rising and falling transitions of the bitline. The memory access time reduction is achieved without the need for any increase in the size of the memory cell transistors, and the resulting memory device is therefore area efficient.

A memory device in accordance with the invention may be implemented, for example, as a stand-alone memory device, such as a packaged integrated circuit, or as an embedded memory in a microprocessor or other processing device.

DETAILED DESCRIPTION OF THE INVENTION

The invention will be illustrated herein in conjunction with exemplary semiconductor memory devices and associated memory cells as well as other related circuitry. It should be understood, however, that the invention is more generally applicable to any semiconductor memory device in which a reduction in stored data access time is desired, and may be implemented using circuitry other than that specifically shown and described in conjunction with the illustrative embodiments.

Figure 1:
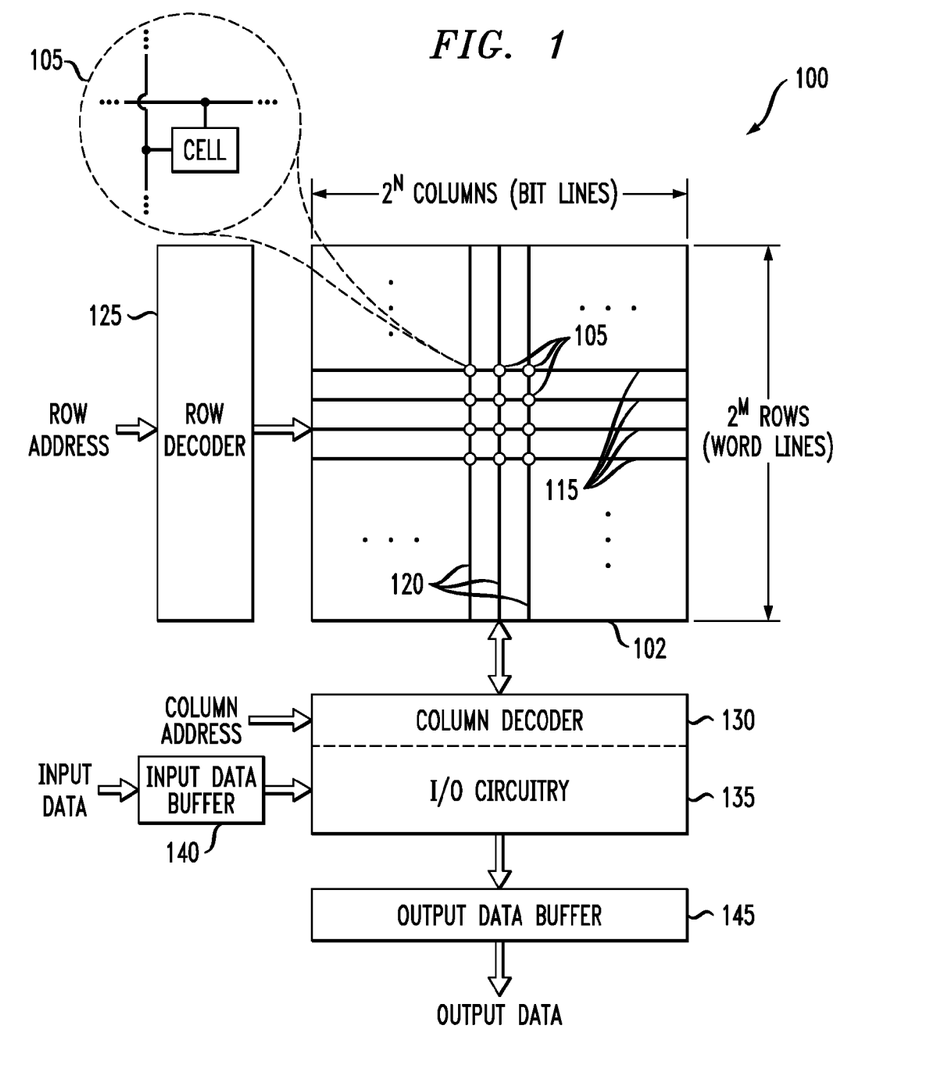
FIG. 1 shows a semiconductor memory device comprising a memory array having a plurality of memory cells and incorporating inverter sensing circuitry and associated access time acceleration circuitry in an illustrative embodiment of the invention.

FIG. 1 shows a simplified diagram of a memory device 100 in accordance with an illustrative embodiment of the invention. The memory device 100 comprises a memory array 102. The memory array 102 comprises a plurality of memory cells 105 each configured to store data. For example, the memory cells may each be configured to store a single bit of data, and such memory cells are also referred to herein as bit-cells. Each cell 105 is coupled to a corresponding row or wordline 115 and column or bitline 120. The memory array therefore includes a memory cell at each point where a wordline intersects with a bitline. The memory cells of the memory array are illustratively arranged in $2^N$ columns and $2^M$ rows. The values selected for N and M in a given implementation will generally depend upon on the data storage requirements of the application in which the memory device is utilized.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise inverter sensing circuitry and associated access time acceleration circuitry, as will be described in greater detail in conjunction with FIGS. 3 and 4. The operation of other memory device elements such as row decoder 125, column decoder 130, and buffers 140, 145 is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

It should be noted that the memory device 100 in one or more of the illustrative embodiments is assumed to comprise an SRAM device. However, as indicated previously, the disclosed access time acceleration techniques can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. The invention is thus not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing the invention.

The present embodiment of memory device 100 is advantageously configured to avoid the drawbacks of conventional practice through the use of access time acceleration circuitry that is illustratively implemented in I/O circuitry 135. As will be described below in conjunction with FIGS. 2 through 6, the access time acceleration circuitry in these embodiments provides a significant reduction in the time required to read stored data from the memory cells 105 when using inverter sensing. This access time reduction is achieved while also maintaining the advantages of conventional inverter sensing, such as avoiding local transistor mismatch and precharge issues associated with sense amplifier circuitry. In addition, use of inverter sensing allows output latch logic to be eliminated.

Figure 2:
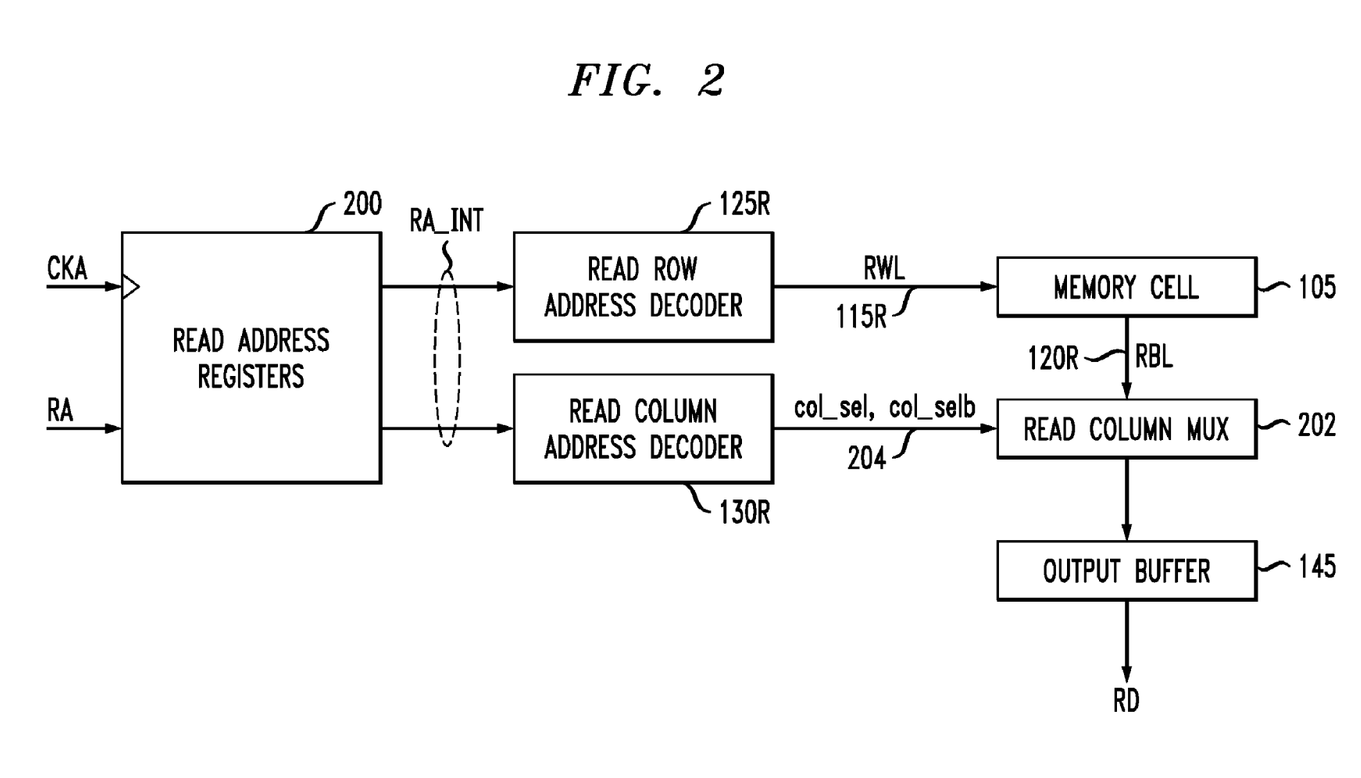
FIG. 2 shows an exemplary read channel in the memory device of FIG. 1.

FIG. 2 shows an exemplary read channel in the memory device 100 of FIG. 1. In the read channel, read address registers 200 receive as inputs a read address (RA) and an address clock (CKA). The address clock CKA may be derived from or correspond to the memory device clock signal also referred to herein as clk. The read address comprises a row address and a column address, collectively designated as RA_INT in FIG. 2. The row and column portions of RA_INT are applied to respective read row address decoder 125R and read column address decoder 130R, which correspond generally to read parts of the respective row and column decoders 125 and 130 of FIG. 1. An output of the read row address decoder is coupled to a given memory cell 105 via read wordline 115R. The memory cell 105 is also coupled via read bitline 120R to a read column multiplexer 202. The read column multiplexer 202 is assumed to be part of the I/O circuitry 135, and receives an uncomplemented column select signal col_sel and a corresponding complemented column select signal col_selb from the read column address decoder 130R via line 204. A data output of the read column multiplexer is coupled to an input of the output data buffer 145, which generates corresponding read data (RD) at its output. The read wordline 115R and read bitline 120R will also be referred to herein as RWL and RBL, respectively.

In the exemplary read channel as illustrated in FIG. 2, RWL is asserted by read row address decoder 125R responsive to a rising edge of address clock signal CKA, thereby allowing RBL to rise or fall in accordance with the logic level of the data bit stored in the memory cell 105. Assume by way of example that a stored logic '1' bit will cause RBL to rise and a stored logic '0' bit will cause RBL to fall. In this embodiment, it is further assumed that inverter sensing is used, and there is no output latch, so RWL remains asserted for a full cycle of the read operation.

The memory access time in this case may be divided into three delay intervals, namely, CKA rising edge to RWL assertion, RWL assertion to RBL transition, and RBL transition to output (Q) transition. Of these three, the RWL assertion to RBL transition is the dominant delay interval because the RBL transition takes place through memory cell transistors which are implemented as relatively small size devices in order to save circuit area. Any attempt to shorten the delay interval between RWL assertion and RBL transition by increasing the size and drive strength of the memory cell transistors will lead to a significant area penalty. Advantageously, the access time acceleration circuitry implemented in memory device 100 overcomes this problem by shortening the amount of time between RWL assertion and RBL transition for both rising and falling RBL, without the need for any increase in the size of the memory cell transistors.

Figure 3:
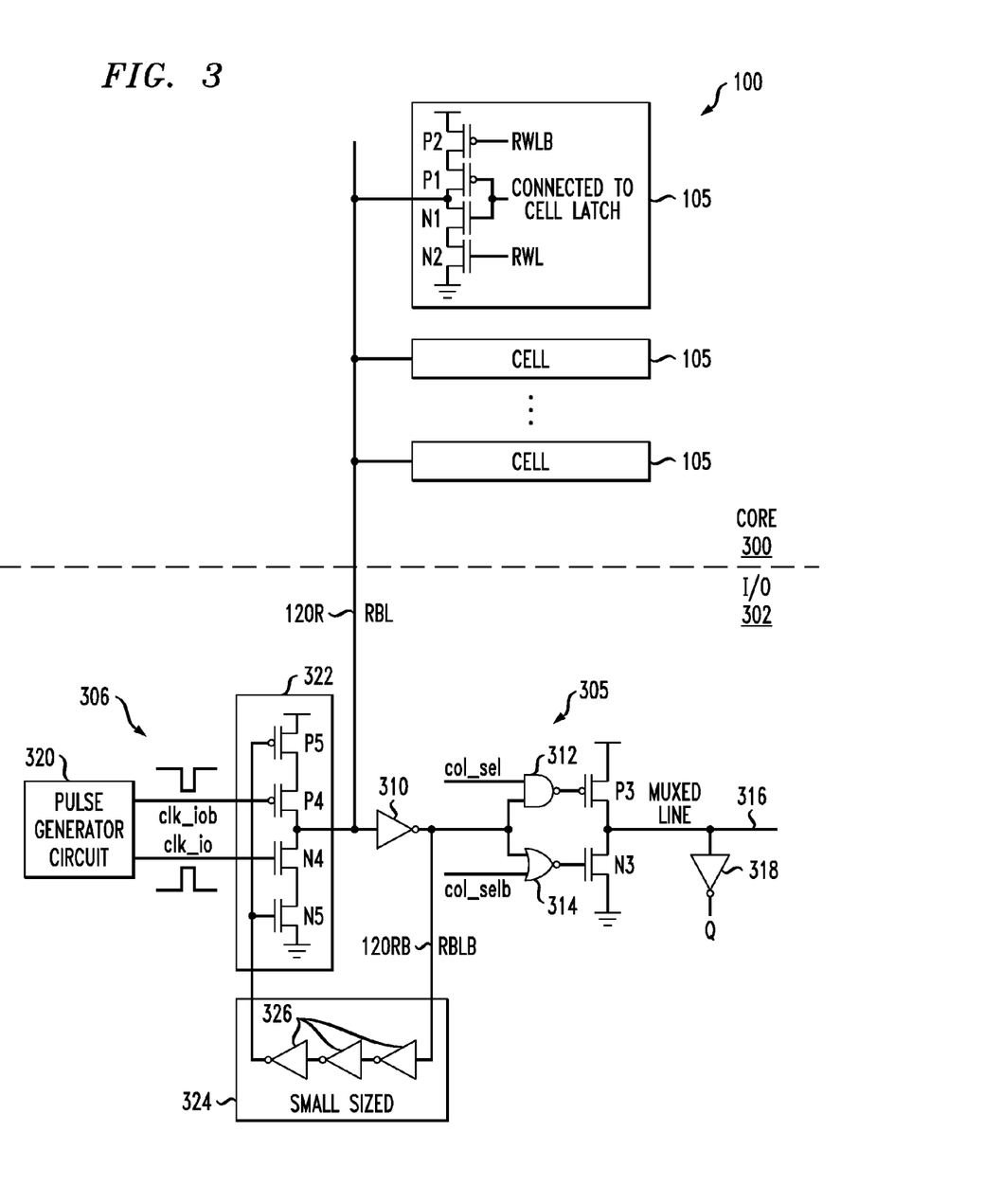
FIG. 3 shows a more detailed view of a portion of the memory device of FIG. 1 illustrating the inverter sensing circuitry and associated access time acceleration circuitry.

FIG. 3 shows a more detailed view of a portion of the memory device 100, illustrating the configuration of the inverter sensing circuitry and its associated access time acceleration circuitry in one embodiment. In this embodiment, the memory device 100 comprises a core region 300 that includes the memory cells 105 of the memory array 102, and an I/O region 302 that includes inverter sensing circuitry 305 and access time acceleration circuitry 306, which may be viewed as collectively comprising at least a portion of the read column multiplexer 202 of FIG. 2.

It is to be understood that the inverter sensing circuitry 305 and access time acceleration circuitry 306 in the FIG. 3 embodiment are assumed for purposes of illustration to be associated with a particular bitline 120 of the memory array 102, and thus with a particular column of memory cells 105 in the array. The arrangement of circuitry 305, 306 will therefore generally be repeated for each of the other bitlines of the memory array, with the exception of the pulse generator circuit, which may be shared across multiple bitlines. However, the terms "sensing circuitry" and "access time acceleration circuitry" as used herein are intended to be broadly construed so as to encompass arrangements of such circuitry for one bitline or for multiple bitlines.

As illustrated in FIG. 3, there is a single column of memory cells 105 associated with the read bitline 120R, also denoted RBL, within memory array 102. A given one of these memory cells 105 is shown in greater detail at the top of the figure, and comprises four transistors, including two NMOS transistors denoted N1 and N2, and two PMOS transistors denoted P1 and P2. Each such memory cell stores a single bit of data. The gates of transistors N1 and P1 are coupled together and connected to a cell latch signal line as indicated, while the gates of transistors N2 and P2 are coupled to respective uncomplemented and complemented read wordlines, denoted RWL and RWLB, which collectively correspond to read wordline 115R. Transistor N2 has its source coupled to a lower supply node of the memory device, illustratively ground potential or VSS, and its drain coupled to the source of transistor N1. Similarly, transistor P2 has its source coupled to an upper supply node of the memory device, illustratively VDD, and its drain coupled to the source of transistor P1. Also, the drains of transistors N1 and P1 are coupled together and connected to the RBL 120R. It is to be appreciated that this particular type of memory cell is presented by way of illustrative example only, and a wide variety of other types of memory cells may be utilized in implementing the present invention.

As will be described below, the inverter sensing circuitry 305 coupled to the memory array 102 is used to read data stored in the column of memory cells 105 that are coupled to RBL. The amount of time it takes to access the data stored in a selected one of these memory cells is determined at least in part by the access time acceleration circuitry 306 which is also coupled to RBL. More specifically, the access time acceleration circuitry 306 is operative to significantly reduce the delay interval between a given RWL assertion and the corresponding RBL transition for both rising and falling RBL. Thus, the memory cell access time is significantly reduced relative to what it would otherwise be without the access time acceleration circuitry. As mentioned previously, this reduction in memory access time is achieved without the need for any increase in the size of the memory cell transistors.

The inverter sensing circuitry 305 comprises a bitline sensing inverter 310 having an input coupled to RBL, and column select circuitry which includes 2-input NAND gate 312, 2-input NOR gate 314, NMOS transistor N3 and PMOS transistor P3. The column select circuitry is coupled between an output of the inverter 310 and a multiplexed output line 316 shared by a plurality of bitlines 120 of the memory array 102. More specifically, first inputs of the NAND gate 312 and the NOR gate 314 are coupled together and to the output of the inverter 310. Second inputs of the NAND gate 312 and the NOR gate 314 receive the respective uncomplemented and complemented column select signals col_sel and col_selb associated with line 204 of FIG. 2. An inverter 318 coupled to the multiplexed line 316 provides a read data output, also denoted as Q.

The inverter sensing circuitry 305 should be viewed as an example of what is more generally referred to herein as "sensing circuitry." In other embodiments of the invention, a variety of different types of sensing circuitry may be used, including sensing circuitry that does not rely upon inverter sensing.

The access time acceleration circuitry 306 in this embodiment comprises a pulse generator circuit 320, a reference memory cell 322, and feedback circuitry 324. The pulse generator circuit 320 is configured to generate respective uncomplemented and complemented clock pulse signals clk_io and clk_iob for application to respective transistors of the reference memory cell. An exemplary circuit for generating these clock pulse signals will be described in detail below with reference to FIG. 4. As shown in FIG. 3, clk_io is a positive pulsed signal and clk_iob is the complementary negative pulsed signal. The pulse is triggered with a rising edge of a clock signal of the memory device 100, and the width or duration of the pulse is controlled by the FIG. 4 circuitry as will be described.

The reference memory cell 322 has a four-transistor structure generally similar to that of a given one of the memory cells 105 of memory array 102. More specifically, the reference memory cell 322 includes two NMOS transistors N4 and N5, and two PMOS transistors P4 and P5. The gates of transistors N4 and P4 receive the respective clock pulse signals clk_io and clk_iob from the pulse generator circuit 320, while the gates of transistors N5 and P5 are both driven by an output of the feedback circuitry 324. Transistor N5 has its source coupled to a lower supply node of the memory device, illustratively ground potential or VSS, and its drain coupled to the source of transistor N4. Similarly, transistor P5 has its source coupled to an upper supply node of the memory device, illustratively VDD, and its drain coupled to the source of transistor P4. Also, the drains of transistors N4 and P4 are coupled together and connected to RBL.

The structure of the reference memory cell 322 will generally track that of the actual memory cell 105, and so different arrangements may be used depending on the particular type of memory cell implemented in a given embodiment. More generally, the term "reference memory cell" as used herein should be understood to encompass circuitry arrangements that replicate significant portions of the actual memory cell and provide one or more charging or discharging paths to supplement the operation of charging or discharging paths of the actual memory cell.

It is to be appreciated that the reference memory cell 322 in the present embodiment is not configured to store data, but is instead arranged in the form of a type of tri-state structure with its output connected to RBL. As such it serves to provide additional drive strength to supplement that of a given selected memory cell 105 in pulling up or pulling down RBL. The transistors N4, N5, P4 and P5 of the reference memory cell 322 are sized to mimic the corresponding transistors N1, N2, P1 and P2 of the actual memory cell 105, and therefore there is no significant local transistor mismatch between the cells 322 and 105.

The feedback circuitry 324 has an input coupled to an output of the inverter 310 and an output that is coupled to the gates of the transistors N5 and P5 of the reference memory cell 322. The input of the feedback circuitry 324 is also denoted as RBLB in the figure, since it is the complement of RBL, as generated by inverter 310.

The feedback circuitry 324 in this embodiment more particularly comprises a plurality of "small sized" inverters 326 connected in series with one another, with a first one of the inverters of the series connection of inverters having an input coupled to an output of inverter 310 and a final one of the inverters of the series connection of inverters having an output coupled to the gates of the transistors N5 and P5. The inverters 326 generally perform an early data prediction function in the access time acceleration circuitry 306. More specifically, these inverters are configured to sample the last state of RBL and to provide feedback on that state to the reference memory cell 322. Although three inverters 326 are used in the feedback circuitry 324 in this embodiment, different numbers of inverters, or other types of circuit elements, may be used in the feedback circuitry 324 in other embodiments.

The inverters 326 are referred to as "small sized" in that the transistors used to implement these inverters are relatively small and therefore exhibit lower drive strength compared to those that may be used in other portions of the device. The term "small sized" in this context may be understood to refer to the smallest transistor width and length dimensions that are available for a given process technology. For example, for a 28 nanometer process technology, the width and length dimensions may be 0.2 micrometers and 0.4 micrometers, respectively. The use of such inverters in the feedback path is appropriate as this path is not time critical in the present embodiment.

The operation of the FIG. 3 circuitry will now be described in more detail. The uncomplemented column select signal col_sel is an active high multiplexer selection signal in this embodiment. Thus, when col_sel is high, the corresponding read bitline denoted RBL is selected to have its data pass to output Q, and when col_sel is low, RBL will not be permitted to pass its data to read data output Q. When RWL is asserted to read the data bit stored in the selected memory cell 105, RBL starts rising or falling depending upon the logic value of the data bit stored in that particular memory cell.

Assume initially that RBL is initially at a logic '0' level and the data bit stored in the selected memory cell 105 is at a logic '1' level. In this case, when RWL is asserted, the voltage on RBL begins rising. If RBL were pulled up by the transistors of the selected memory cell 105 only, it would generally have an excessively long rising slope, leading to a long memory access time. However, because the last data on RBL prior to start of the current access cycle was at a logic '0' level, the output of the feedback circuitry 324 will also be at a logic '0' level, which activates an additional pull-up path for RBL through the PMOS transistors P4 and P5 of reference memory cell 322 when the clock pulse signal clk_io goes high.

Accordingly, RBL in this case is pulled up both by the selected memory cell 105 as well as by the additional pull-up path established through the transistors P4 and P5 of the reference memory cell 322, for the duration of the pulse of the clk_io signal. This significantly improves the rising slope of the RBL transition, thereby reducing the access time. The duration of the pulse of the clk_io signal determines the amount of additional pull-up assistance provided to RBL. More particularly, the longer the pulse duration, the more pull-up assistance is provided, and the shorter the time between assertion of RWL and the transition in RBL.

It should be noted that the RWL and ted that the RWL and clk_io signal paths are matched so as to ensure that their respective rising edges occur at nearly the same time. This is apparent from FIG. 4, which illustrates the generation of the clk_io and clk_iob clock pulse signals in pulse generator circuit 320 using predecoder ("predec") circuitry 402 and row decoder ("rowdec") circuitry 404. The predecoder circuitry 402 and row decoder circuitry 404 in this embodiment are assumed to be substantially the same circuitry used in read row address decoder 125R to generate the RWL signals. A serial arrangement of inverters 406 is used to set the duration of the clk_io signal pulse.

Figure 4:
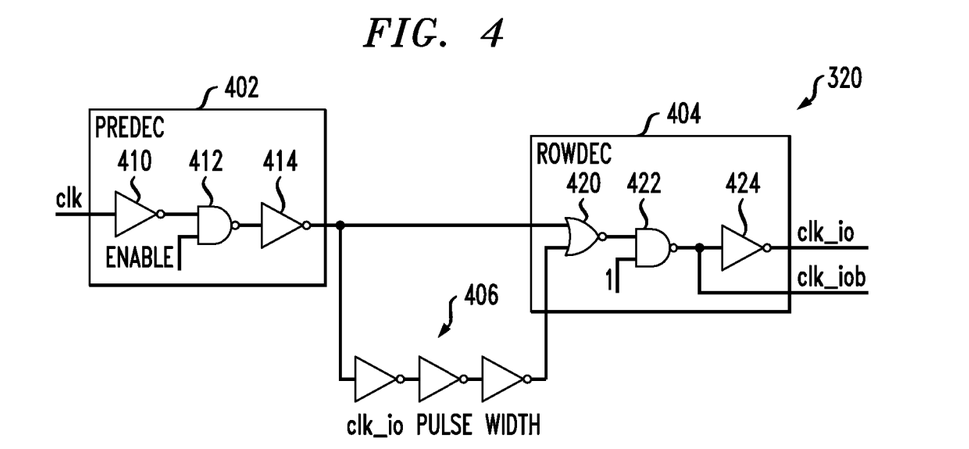
FIG. 4 shows a pulse generator circuit that is used to provide clock pulses in the access time acceleration circuitry of FIG. 3.

The predecoder circuitry 402 comprises inverter 410, 2-input NAND gate 412, and inverter 414, arranged in series. A memory device clock signal clk is applied to the input of the inverter 410. An enable signal is applied to one of the inputs of the NAND gate 412. The row decoder circuitry 404 comprises a 2-input NOR gate 420, a 2-input NAND gate 422, and an inverter 424, also arranged in series.

The serial arrangement of inverters 406 is coupled between the output of inverter 414 and one of the inputs of the NOR gate 420. Outputs of the row decoder circuitry 404 provide the clk_io and clk_iob clock pulse signals for application to reference memory cell 322. The load on the clk_io signal line is substantially the same as that on the RWL signal line, which further helps to ensure that the rising edges of the corresponding signals will have substantially the same slope.

The access time acceleration functionality of the FIG. 3 circuitry can be easily turned on or off as needed, by applying an appropriate logic signal to the enable input of the NAND gate 412 in the predecoder circuit 402. For example, the acceleration may be turned on and off dynamically to allow dynamic frequency scaling of a system-on-a-chip (SOC) or other processing device by an application running on that device.

Also, memory access will function normally in the absence of the generation of the clk_io pulse, albeit with longer access time, and so the memory device 100 may be considered robust to failures in the access time acceleration circuitry 306.

Additional operating scenarios of the FIG. 3 circuitry will now be described. Advantageously, an access time reduction similar to that described above for the case of a rising transition in RBL is also provided by the access time acceleration circuitry 306 for a falling transition in RBL. More particularly, assume now that RBL is initially at a logic '1' level and the data bit stored in the selected memory cell 105 is at a logic '0' level. In this case, when RWL is asserted, the voltage on RBL begins falling. If RBL were pulled down by the transistors of the selected memory cell 105 only, it would generally have an excessively long falling slope, leading to a long memory access time. However, because the last data on RBL prior to start of the current access cycle was at a logic '1' level, the output of the feedback circuitry 324 will also be at a logic '1' level, which activates an additional pull-down path for RBL through the NMOS transistors N4 and N5 of reference memory cell 322 when the clock pulse signal clk_io goes high.

Accordingly, RBL is pulled down both by the selected memory cell 105 as well as by the additional pull-down path established through the transistors N4 and N5 of the reference memory cell 322, for the duration of the pulse of the clk_io signal. This significantly improves the falling slope of the RBL transition, thereby reducing the access time. The duration of the pulse of the clk_io signal determines the amount of additional pull-down assistance provided to RBL. More particularly, the longer the pulse duration, the more pull-down assistance is provided, and the shorter the time between assertion of RWL and the transition in RBL.

The additional pull-up and pull-down paths referred to in the above description may be collectively viewed as examples of what are more generally referred to herein as "supplemental charging and discharging paths." Such paths are configured to supplement the operation of charging or discharging paths of the selected memory cell 105 from which data is being read in the current access cycle. The term is intended to encompass any arrangement of at least one supplemental charging path and at least one supplemental discharging path, such as a single additional pull-up path and a single additional pull-down path, with selection between such paths being based on data accessed via the bitline in a previous access cycle.

In cases in which the last data on RBL and the data stored in the selected memory cell 105 are at the same logic level, a small but undesired transition will occur on RBL. For example, assume now that RBL is initially at a logic '0' level and the data bit stored in the selected memory cell 105 is also at a logic '0' level. In this case, when RWL is asserted, the voltage on RBL is initially pulled up by a pull-up path through transistors P4 and P5 of the reference memory cell 322, even though RBL should remain at a logic '0' level based on the stored data in the selected memory cell. Thus, in this case the additional pull-up path established through transistors P4 and P5 of the reference memory cell opposes the pull-down path established through the corresponding transistors of the selected memory cell, for the duration of the clk_io pulse, leading to the undesired transition. However, this undesired transition is by design insufficient to cause RBL to cross the switching threshold of inverter 310, and therefore does not impact the final read data output.

A similar situation arises when RBL is initially at a logic '1' level and the data bit stored in the selected memory cell 105 is also at a logic '1' level. In this case, when RWL is asserted, the voltage on RBL is initially pulled down by a pull-down path through transistors N4 and N5 of the reference memory cell 322, even though RBL should remain at a logic '1' level based on the stored data in the selected memory cell. Thus, in this case the additional pull-down path established through transistors N4 and N5 of the reference memory cell opposes the pull-up path established through the corresponding transistors of the selected memory cell, for the duration of the clk_io pulse, leading to the undesired transition. Again, this undesired transition is by design insufficient to cause RBL to cross the switching threshold of inverter 310, and therefore does not impact the final read data output.

Figure 5:
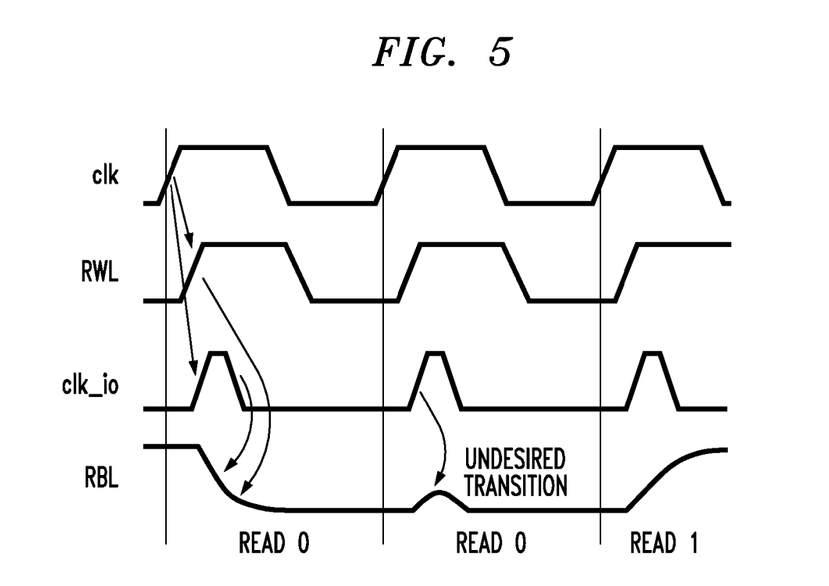
FIG. 5 is a timing diagram illustrating the operation of the circuitry shown in FIG. 3.
Figure 6A:
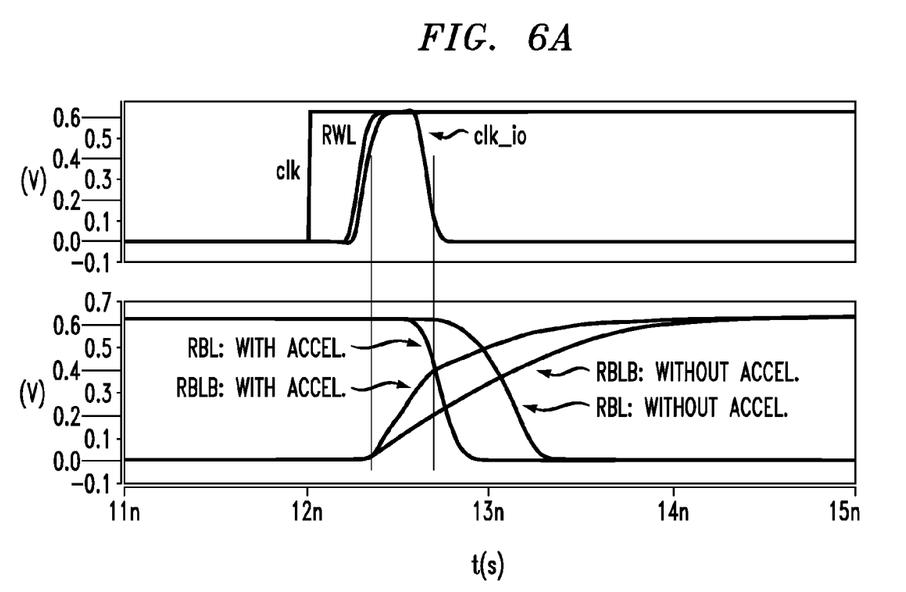
FIGS. 6A and 6B compare certain signals generated within an exemplary implementation of the FIG. 3 circuitry with and without access time acceleration.
Figure 6B:
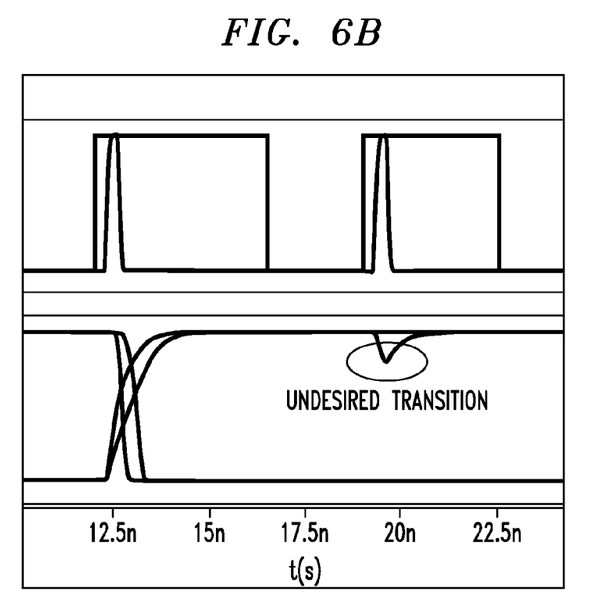

Examples of the signal timing associated with the above-described access time acceleration in the FIG. 3 circuitry can be seen with reference to the diagrams of FIGS. 5 and 6. Referring initially to FIG. 5, relationships between exemplary RWL, RBL and clk_io signals are shown relative to the memory device clock signal clk, for three different read cases. These three cases include two Read 0 cases and a Read 1 case, which are arranged in that order along the horizontal axis of the timing diagram.

In the first Read 0 case, the last data on RBL prior to assertion of RWL is at a logic '1' level and the data to be read from the selected memory cell is at a logic '0' level. In this case, the additional pull-down path established through transistors N4 and N5 for the duration of the clk_io pulse helps to accelerate the transition in RBL.

In the second Read 0 case, the last data on RBL prior to assertion of RWL is at a logic '0' level and the data to be read from the selected memory cell is also at a logic '0' level. In this case, the pull-up path established through transistors P4 and P5 for the duration of the clk_io pulse opposes the normal pull-down path through the selected memory cell, leading to an undesired transition of the type shown in the diagram and previously described. However, as indicated above, this undesired transition remains below the switching threshold of the inverter 310, and thus does not adversely impact the read data output.

In the Read 1 case, the last data on RBL prior to assertion of RWL is at a logic '0' level and the data to be read from the selected memory cell is at a logic '1' level. In this case, the additional pull-up path established through transistors P4 and P5 for the duration of the clk_io pulse helps to accelerate the transition in RBL.

Referring now to FIG. 6A, the upper portion of the diagram shows superimposed elk, RWL and clk_io signals. It can be seen that the rising edges of the RWL and elk_io signals occur at nearly the same time and have similar slopes. The lower portion of the diagram illustrates superimposed RBL and RBLB signals both with and without the use of access time acceleration. It can be seen that a significant reduction in the delay between assertion of RWL and transition in RBL and RBLB is achieved using the access time acceleration, relative to inverter sensing without the use of access time acceleration. FIG. 6B shows the superimposed signals on a longer time scale, illustrating the relationship between the clk, RWL and clk_io signals and the corresponding RBL and RBLB signals, over multiple access cycles. In the second access cycle shown, the last data on RBL and the data to be read from the selected cell are at the same logic level, leading to an undesired transition as illustrated. Simulations of the FIG. 3 circuitry over expected process corners as well as voltage variations of +/−30% and temperature variations of −40° C. to 125° C. indicate that undesired transitions of the type described herein will not trigger the inverter 310 even in the presence of these variations.

The arrangements of sensing circuitry and associated access time acceleration circuitry as described in conjunction with FIGS. 3 through 6 above provide a number of advantages relative to conventional arrangements. As indicated previously, the disclosed arrangements exhibit a significantly reduced delay interval between a given RWL assertion and the corresponding RBL transition, leading to shorter memory access time for both rising and falling RBL transitions. These advantages are achieved without the need for any increase in the size of the memory cell transistors, and the resulting memory device is therefore area efficient. The disclosed techniques can be adapted in a straightforward manner for use with a wide variety of other column multiplexing or I/O circuitry arrangements than those described herein.

It should be noted that use of PMOS or NMOS devices for particular transistors in the embodiments of circuitry described above is by way of illustrative example. In other embodiments, the conductivity types of certain ones of the various transistors may be reversed, and other suitable modifications made to the circuitry, as would be appreciated by one skilled in the art.

A given memory device configured in accordance with the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory implemented within a microprocessor, digital signal processor (DSP), application-specific integrated circuit (ASIC), field-programmable gate array (FPGA) or other type of processor or integrated circuit device.

Figure 7:
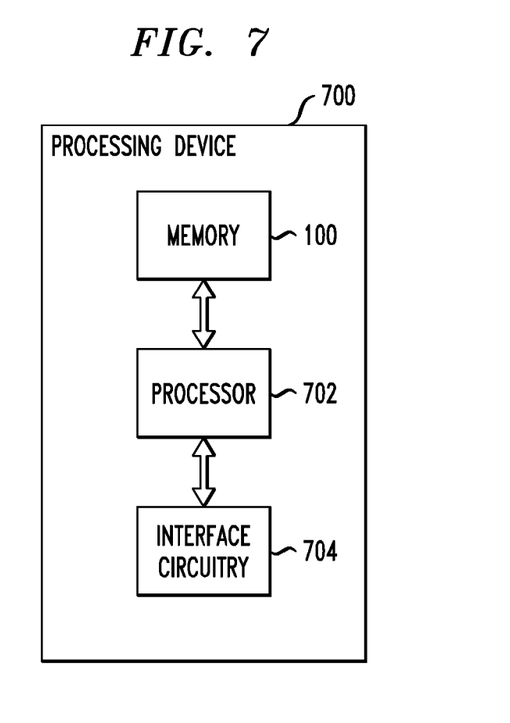
FIG. 7 is a block diagram of a processing device which incorporates the memory device of FIG. 1.

FIG. 7 shows an example of a processing device 700 which incorporates the memory device 100 of FIG. 1. In this embodiment, the memory device 100 is coupled to a processor 702. The processing device further includes interface circuitry 704 coupled to the processor 702. The processing device 700 may comprise, for example, a computer, a server or a portable communication device such as a mobile telephone. The interface circuitry 704 may comprise one or more transceivers for allowing the device 700 to communicate over a network.

Figure 8:
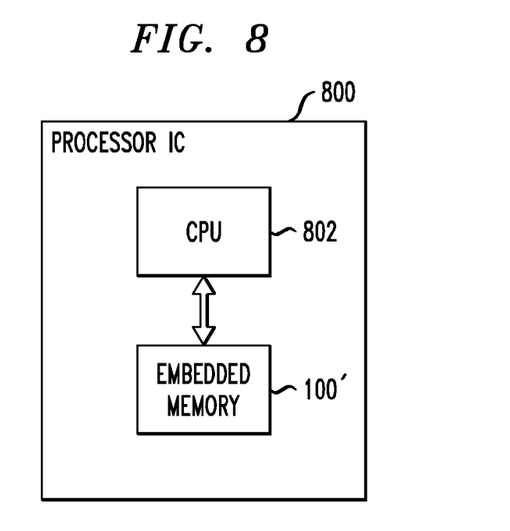
FIG. 8 is a block diagram of a processor integrated circuit which incorporates the memory device of FIG. 1 as an embedded memory.

Alternatively, processing device 700 may comprise a microprocessor, DSP or ASIC, with processor 702 corresponding to a central processing unit (CPU) and memory device 100 providing at least a portion of an embedded memory of the microprocessor, DSP or ASIC. FIG. 8 shows an example of an arrangement of this type, with processor integrated circuit 800 incorporating the memory device of FIG. 1 as an embedded memory 100'. The embedded memory 100' in this embodiment is coupled to a CPU 802.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of memory arrays, memory cell circuitry, sensing circuitry, access time acceleration circuitry, transistor conductivity types, control signals, and other elements for implementing the described functionality. These and numerous other alternative embodiments within the scope of the following claims will be apparent to those skilled in the art.

What is claimed is:

1. A memory device comprising:
 a memory array comprising a plurality of memory cells arranged in rows and columns;
 sensing circuitry coupled to at least a given bitline associated with a particular column of the memory cells of the memory array; and
 access time acceleration circuitry coupled to the bitline;
 wherein the access time acceleration circuitry is configured to control an amount of time required by the sensing circuitry to access data stored in a given one of the memory cells in the particular column of memory cells, by providing in a current access cycle at least a selected one of a plurality of different supplemental charging and discharging paths for the bitline based at least in part on data accessed using the bitline in a previous access cycle.

2. The memory device of claim 1 wherein the plurality of different supplemental charging and discharging paths comprises an additional pull-up path configured to supplement operation of a pull-up path of the given memory cell and an additional pull-down path configured to supplement operation of a pull-down path of the given memory cell.

3. The memory device of claim 2 wherein the access time acceleration circuitry is configured to select the additional pull-up path for the bitline if the data accessed using the bitline in the previous access cycle has a logic low level.

4. The memory device of claim 2 wherein the access time acceleration circuitry is configured to select the additional pull-down path for the bitline if the data accessed using the bitline in the previous access cycle has a logic high level.

5. The memory device of claim 1 wherein the access time acceleration circuitry comprises:
 a pulse generator circuit;
 a reference memory cell having an input coupled to an output of the pulse generator circuit and an output coupled to the bitline; and
 feedback circuitry having an input coupled to an output of a bitline sensing inverter of the sensing circuitry and an output coupled to another input of the reference memory cell.

6. The memory device of claim 5 wherein the pulse generator circuit is configured to generate complemented and uncomplemented clock pulse signals for application to respective transistors of the reference memory cell.

7. The memory device of claim 6 wherein a first one of the transistors is part of a supplemental charging path and a second one of the transistors is part of a supplemental discharging path, and wherein a pulse duration of said clock pulse signals determines an amount of time for which said selected supplemental path is enabled.

8. The memory device of claim 5 wherein the feedback circuitry comprises a plurality of inverters connected in series with one another, a first one of the inverters of the series connection of inverters having an input coupled to the output of the bitline sensing inverter of the sensing circuitry and a final one of the inverters of the series connection of inverters having an output coupled to said other input of the reference memory cell.

9. The memory device of claim 5 wherein the reference memory cell comprises:
 a first NMOS transistor having its source coupled to a lower supply node;
 a first PMOS transistor having its source coupled to an upper supply node;

a second NMOS transistor having its source coupled to a drain of the first NMOS transistor; and a second PMOS transistor having its source coupled to a drain of the first PMOS transistor;

wherein drains of the second NMOS transistor and the second PMOS transistor are coupled together at the output of the reference memory cell;

wherein gates of the first NMOS transistor and the first PMOS transistor are coupled to the output of the feedback circuitry; and wherein gates of the second NMOS transistor and the second PMOS transistor are coupled to respective complemented and uncomplemented outputs of the pulse generator circuit.

10. The memory device of claim 1 wherein said selected supplemental path is enabled for an amount of time that is substantially less than a duration of the current access cycle and is determined by a pulse width of a clock pulse signal generated by a pulse generator circuit of the access time acceleration circuitry.

11. An integrated circuit comprising the memory device of claim 1.

12. A processing device comprising the memory device of claim 1.

13. An apparatus comprising:
access time acceleration circuitry configured to control an amount of time required to access data stored in a memory cell of a memory array, by providing in a current access cycle at least a selected one of a plurality of different supplemental charging and discharging paths for a corresponding bitline of the memory array based at least in part on data accessed using the bitline in a previous access cycle.

14. The apparatus of claim 13 wherein the plurality of different supplemental charging and discharging paths comprises an additional pull-up path configured to supplement operation of a pull-up path of the memory cell and an additional pull-down path configured to supplement operation of a pull-down path of the memory cell.

15. The apparatus of claim 14 wherein the access time acceleration circuitry is configured to select the additional pull-up path for the bitline if the data accessed using the bitline in the previous access cycle has a logic low level.

16. The apparatus of claim 14 wherein the access time acceleration circuitry is configured to select the additional pull-down path for the bitline if the data accessed using the bitline in the previous access cycle has a logic high level.

17. A method comprising:
providing a memory array comprising a plurality of memory cells; and
controlling an amount of time required to access data stored in a given one of the memory cells;
wherein said controlling comprises providing in a current access cycle at least a selected one of a plurality of different supplemental charging and discharging paths for a corresponding bitline of the memory array based at least in part on data accessed using the bitline in a previous access cycle.

18. The method of claim 17 wherein the plurality of different supplemental charging and discharging paths comprises an additional pull-up path configured to supplement operation of a pull-up path of the given memory cell and an additional pull-down path configured to supplement operation of a pull-down path of the given memory cell.

19. The method of claim 18 wherein said controlling further comprises selecting the additional pull-up path for the bitline if the data accessed using the bitline in the previous access cycle has a logic low level.

20. The method of claim 18 wherein said controlling further comprises selecting the additional pull-down path for the bitline if the data accessed using the bitline in the previous access cycle has a logic high level.

* * * * *